(12) United States Patent
Palumbo et al.

(10) Patent No.: US 7,263,016 B1
(45) Date of Patent: Aug. 28, 2007

(54) METHOD AND SYSTEM FOR PRE-CHARGING AND BIASING A LATCH-TYPE SENSE AMPLIFIER

(75) Inventors: William Palumbo, Hampton, NJ (US); Rahul Thukral, Bridgewater, NJ (US); Xian Zhang, Hillsborough, NJ (US)

(73) Assignee: Virage Logic Corporation, Fremont, CA (US)

( * ) Notice: Subject to any disclaimer, the term of this patent is extended or adjusted under 35 U.S.C. 154(b) by 81 days.

(21) Appl. No.: 11/147,790

(22) Filed: Jun. 7, 2005

Related U.S. Application Data

(60) Provisional application No. 60/577,897, filed on Jun. 7, 2004.

(51) Int. Cl.
*G11C 7/00* (2006.01)
*G11C 7/02* (2006.01)

(52) U.S. Cl. ............... 365/205; 365/207; 365/208; 327/57

(58) Field of Classification Search ............... 365/205, 365/207, 208, 185.08; 327/51, 55, 57
See application file for complete search history.

(56) References Cited

U.S. PATENT DOCUMENTS

| | | | |
|---|---|---|---|
| 3,949,381 A | | 4/1976 | Dennard et al. |
| 5,615,161 A | * | 3/1997 | Mu ............... 365/205 |
| 5,646,887 A | | 7/1997 | Truong et al. |
| 5,883,846 A | * | 3/1999 | Lee ............... 365/207 |
| 5,982,202 A | | 11/1999 | Peak, Jr. |
| 5,982,692 A | * | 11/1999 | Lattimore et al. ....... 327/57 |
| 6,031,775 A | * | 2/2000 | Chang et al. ........... 365/205 |
| 6,184,722 B1 | * | 2/2001 | Hayakawa ............ 327/55 |
| 6,317,374 B2 | * | 11/2001 | Feurle .............. 365/205 |
| 6,480,037 B1 | * | 11/2002 | Song et al. ........... 327/55 |
| 6,833,737 B2 | * | 12/2004 | Aipperspach .......... 327/55 |
| 6,850,446 B1 | | 2/2005 | Raszka et al. |
| 6,894,541 B2 | | 5/2005 | Nautiyal et al. |
| 6,992,938 B1 | * | 1/2006 | Shubat et al. ......... 365/185.18 |
| 7,046,045 B2 | * | 5/2006 | Nakazato et al. ....... 327/55 |
| 7,069,522 B1 | | 6/2006 | Sluss et al. |
| 7,130,213 B1 | | 10/2006 | Raszka |
| 7,184,346 B1 | | 2/2007 | Raszka et al. |
| 2007/0041236 A1 | | 2/2007 | Raszka |

OTHER PUBLICATIONS

Sang H. Dhong et al., "A 4.8GHz Fully Pipelined Embedded SRAM in the Streaming Processor of a Cell Processor", ISSCC 2005/ Session 26/ Static Memory/ 26.7, 2005 IEEE International Solid-State Circuits Conference, Digest of Technical Papers, pp. 486-487 & 612.

* cited by examiner

*Primary Examiner*—Trong Phan
(74) *Attorney, Agent, or Firm*—Blakely Sokoloff Taylor & Zafman LLP

(57) ABSTRACT

A method and system for pre-charging and biasing a latch-type sense amplifier are described. According to an embodiment of the invention, the data latch portion of the latch-type sense amplifier includes two cross-coupled inverters having two output nodes, and two input nodes. The input nodes of the data-latch are connected to a pair of complementary bit-lines via bias control transistors. The bias control transistors are to pre-charge the input nodes based on the voltage levels of the bit-lines so as to bias the voltage levels at the input nodes in a direction the input nodes will seek upon activation of the sense amplifier.

10 Claims, 4 Drawing Sheets

US 7,263,016 B1

METHOD AND SYSTEM FOR PRE-CHARGING AND BIASING A LATCH-TYPE SENSE AMPLIFIER

RELATED APPLICATIONS

The present application is related to and claims the benefit of the filing date of U.S. Provisional Patent Application with Ser. No. 60/577,897, filed on Jun. 7, 2004, which is hereby incorporated herein by reference.

TECHNICAL FIELD

The present invention relates generally to sensing small signals in memory circuit designs. More particularly, the present invention relates to an improved sense amplifier design for the fast and reliable sensing of voltage differentials between complementary bit-lines in a memory device.

BACKGROUND

A sense amplifier is a circuit that is used in memory device designs to sense small voltage differentials between two input signals, for example, such as the complementary bit-lines connected to a memory cell. Certain types of regenerative sense amplifier circuits contain circuit nodes that are highly sensitive to electrical noise due to the very high gain nature of some designs. These nodes, if not properly addressed, can cause anything from functional failure to out of specification performance. Accordingly, these nodes must be controlled in such a way as to reduce the susceptibility of faulty operation without adversely impacting the performance characteristics of the sense amplifier function.

FIG. 1 illustrates a schematic diagram of a conventional latch-type, cross-coupled sense amplifier circuit 10 for sensing voltage differentials on a pair of complementary bit-lines. The latch consists of the inverter formed by PMOS and NMOS transistors M1 and M2, which is cross-coupled with the inverter formed by PMOS and NMOS transistors M3 and M4. The bit-lines 12 and 14 are connected to the input nodes of the data-latch via NMOS transistors M5 and M6. When the sense amplifier enable (SAE) signal 16 is in a low voltage state, the data-latch is coupled to VDD via PMOS transistor M7, and isolated from GROUND via NMOS transistor M8. When SAE 16 changes to a high voltage state, the NMOS transistor M8 is enabled, or turned on, thereby forming a circuit path to GROUND and initiating the data latching operation.

One of the problems with the circuit shown in FIG. 1 is that there is nothing to control the voltage levels at the critical nodes CN1 and CN2 just prior to the activation of the sense amplifier. For example, just prior to the circuit being activated (e.g., when the sense amplifier enable signal (SAE) changes from a low to a high voltage state), the voltage levels at theses critical nodes CN1 and CN2 may vary unexpectedly due to electrical noise caused by coupling effects and/or the general characteristics of the silicon substrate. Consequently, the voltage differential may not be sufficient for the latching device to latch the proper data.

One solution to this problem involves utilizing a separate circuit or logic component to apply an overcompensating differential voltage to the sense amplifier thereby overriding any spurious noise present in the critical nodes CN1 and CN2. Another solution is to utilize a pre-charging device to pre-charge the critical nodes CN1 and CN2 and overdrive any spurious noise that may be present. A third solution is to utilize a separate balancing circuit to balance the voltage levels at these critical nodes so as to negate the effect of any spurious noise that may be present. Unfortunately, all three of these solutions negatively impact the performance of the sense amplifier device by generally making each sense/read operation take longer. In addition, the extra set-up circuitry for pre-charging and/or balancing the critical nodes takes up valuable space on the silicon chip and consequently adds to the cost of any memory device that includes such set-up circuitry. An improved method and system for pre-charging and biasing the critical nodes of a latch-type sense amplifier are desirable.

SUMMARY OF THE DESCRIPTION

A method and system for pre-charging and biasing a latch-type sense amplifier are described. According to an embodiment of the invention, the data latch portion of the latch-type sense amplifier includes two cross-coupled inverters having two output nodes, and two input nodes. The input nodes of the data-latch are connected to a pair of complementary bit-lines via bias control transistors. The bias control transistors are to pre-charge the input nodes based on the voltage levels of the bit-lines so as to bias the voltage levels at the input nodes in a direction the input nodes will seek upon activation of the sense amplifier.

BRIEF DESCRIPTION OF THE DRAWINGS

The present invention is illustrated by way of example, and not by way of limitation, in the figures of the accompanying drawings, in which like references indicate similar elements, and in which.

DETAILED DESCRIPTION

In general, a method and system for pre-charging and biasing a latch-type sense amplifier are described. In the following description, for purposes of explanation, numerous specific details are set forth in order to provide a thorough understanding of the present invention. It will be evident, however, to one skilled in the art that the present invention may be practiced without these specific details.

Figure 1:
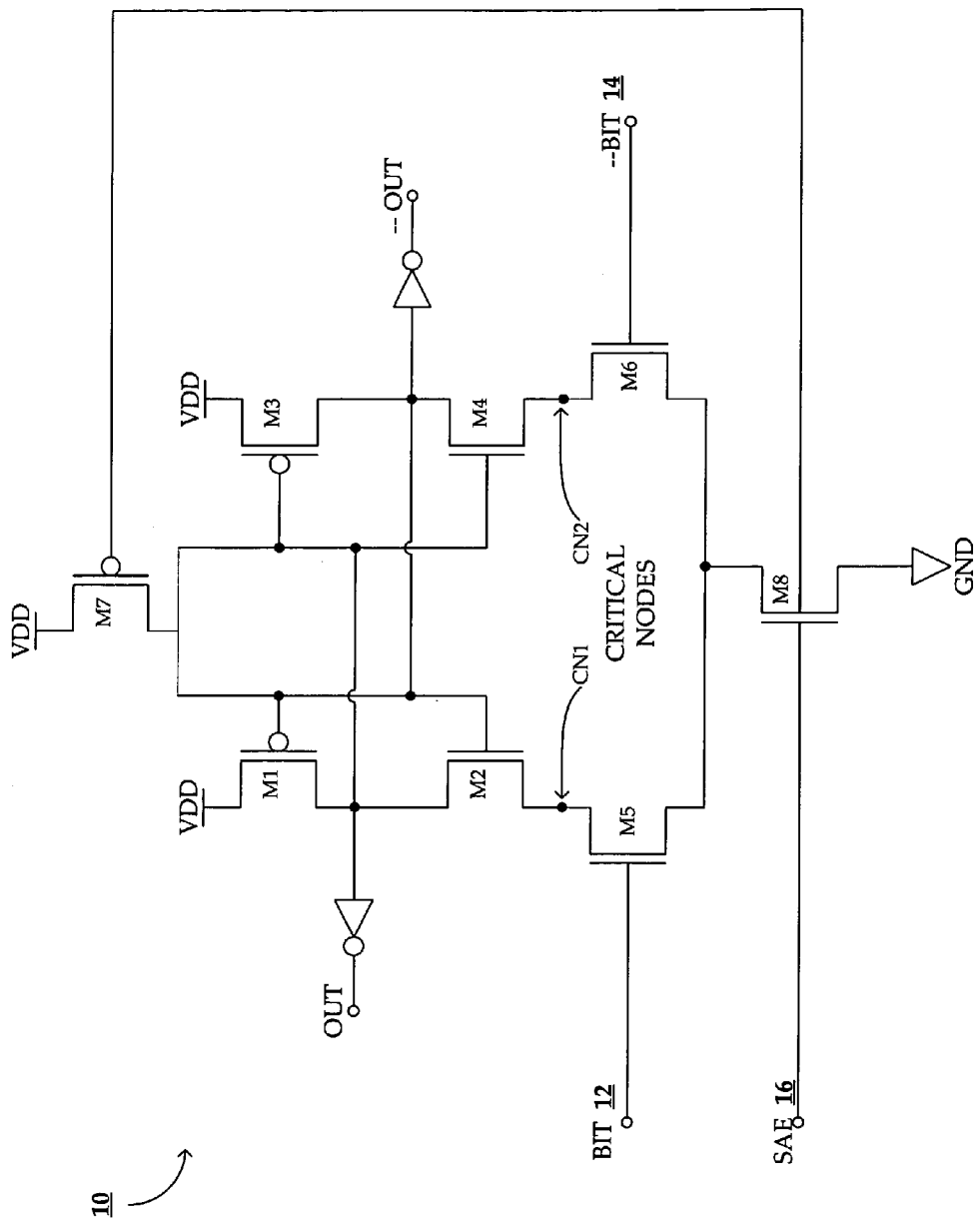
FIG. 1 illustrates a schematic diagram of a conventional (prior art) latch-type, cross-coupled sense amplifier circuit for sensing voltage differentials on a pair of complementary bit-lines.
Figure 2:
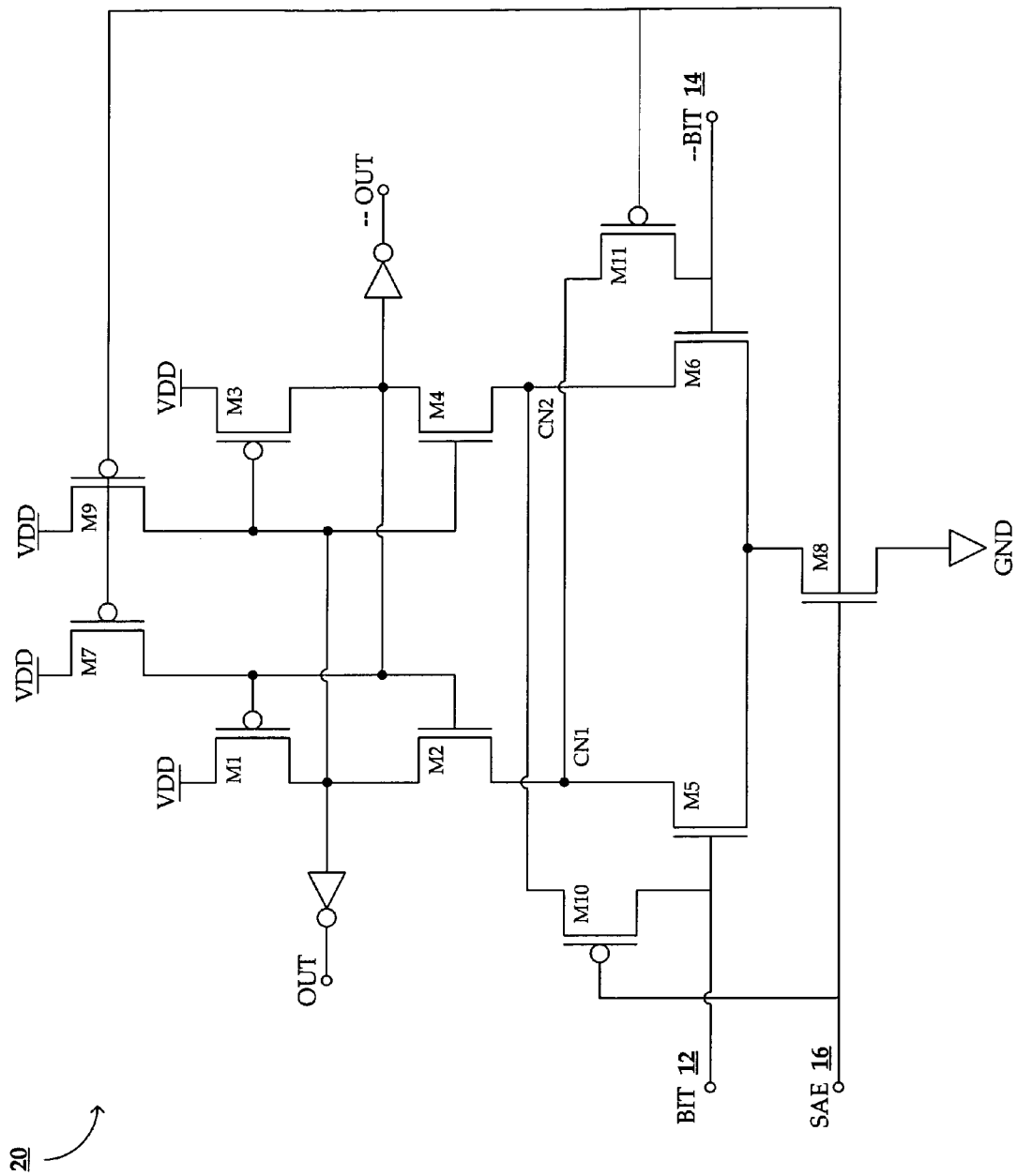
FIG. 2 illustrates a schematic diagram of a latch-type, cross-coupled sense amplifier circuit for sensing voltage differentials on a pair of complementary bit-lines, according to an embodiment of the present invention.

FIG. 2 illustrates a schematic diagram of a latch-type, cross-coupled sense amplifier circuit 20 for sensing voltage differentials on a pair of complementary bit-lines, according to an embodiment of the present invention. The sense amplifier circuit 20 is similar to that illustrated in FIG. 1 with the exception of the addition of PMOS transistors M10 and M11, which serve as bias control transistors to protect the input nodes, or the critical nodes CN1 and CN2, from spurious noise at the critical time—just prior to the activation of the sense amplifier. In addition, the sense amplifier circuit in FIG. 2 is shown to include an additional PMOS transistor M9 connecting the data latch to VDD. However, it will be appreciated by those skilled in the art that in an alternative embodiment of the invention, the function of PMOS transistor M9 may be combined with PMOS transistor M7.

The sense amplifier enable (SAE) signal 16 is coupled to the gate terminals of PMOS transistors M7, M9, M10, M11, and NMOS transistor M8. Accordingly, when SAE is in a low voltage state, the NMOS transistor M8, which serves as a GROUND control transistor, will be disabled, or off, such that the sense amplifier circuit will not have a path to GROUND. At the same time, the PMOS transistors M7, M9, M10 and M11 will be enabled, or on. When the SAE is in a high voltage state, the PMOS transistors M7, M9, M10 and M11 will be disabled, or off, while the GROUND control transistor, NMOS transistor M8, will couple the sense amplifier circuit to GROUND, thereby initiating the latching operation.

As an example, the following is a description of how the circuit operates. Prior to initiating a read operation, the bit-lines (e.g., BIT 12 and –BIT 14) of the memory cell being accessed are pre-charged to a high voltage state. With the SAE signal 16 in a low voltage state, the PMOS transistors M7, M9, M10 and M1 are enabled, or turned on, while the NMOS transistor M8 is disabled, or turned off. Accordingly, at a time just prior to the assertion of SAE, the critical nodes CN1 and CN2 will gravitate to a voltage level equivalent to the voltage level on the bit-lines BIT 12 and –BIT 14. When the word-line for the particular memory cell being read is asserted, one of the two bit-lines (e.g., BIT and –BIT) will be pulled low by the discharging of the memory cell. Accordingly, the voltage levels at the critical nodes may begin to change in conjunction with the discharging of one of the bit-lines. When the SAE signal 16 is asserted, the bit-lines BIT and –BIT are effectively connected to the critical nodes CN1 and CN2, and the data-latch latches the appropriate logical data value based on the differential voltage that develops between the critical nodes CN1 and CN2. Because the critical nodes were pre-charged and biased in relation to the bit-lines just prior to enabling or asserting the SAE signal 16, any voltage differential at the critical nodes CN1 and CN2 is in the direction of the voltage level that the critical nodes seek when the SAE signal 16 is asserted and the data is latched.

In addition to eliminating the need to overcompensate the differential voltage realized at the critical nodes, the addition of PMOS transistors M10 and M11 also eliminates the need to pre-charge and/or equalize the critical nodes CN1 and CN2. The PMOS transistors M10 and M11 facilitate the transfer of the developing differential voltages from the bit-lines (e.g., BIT 12 and –BIT 14) to the appropriate circuit nodes, so as to establish a preset bias voltage in the direction that those nodes will ultimately seek during the actual sensing operation. The preset voltages are in essence biasing the sensitive circuit nodes to the direction of the ultimate voltage transition which the amplification process will follow upon activation. It therefore gives these nodes a head start boost towards the voltage level that will result from the activation of the sense operation (e.g., assertion of SAE 16). Any spurious noise to these critical nodes from signal sources outside the sense amplifier design is overridden by the voltage from the bit-lines.

Figure 3:
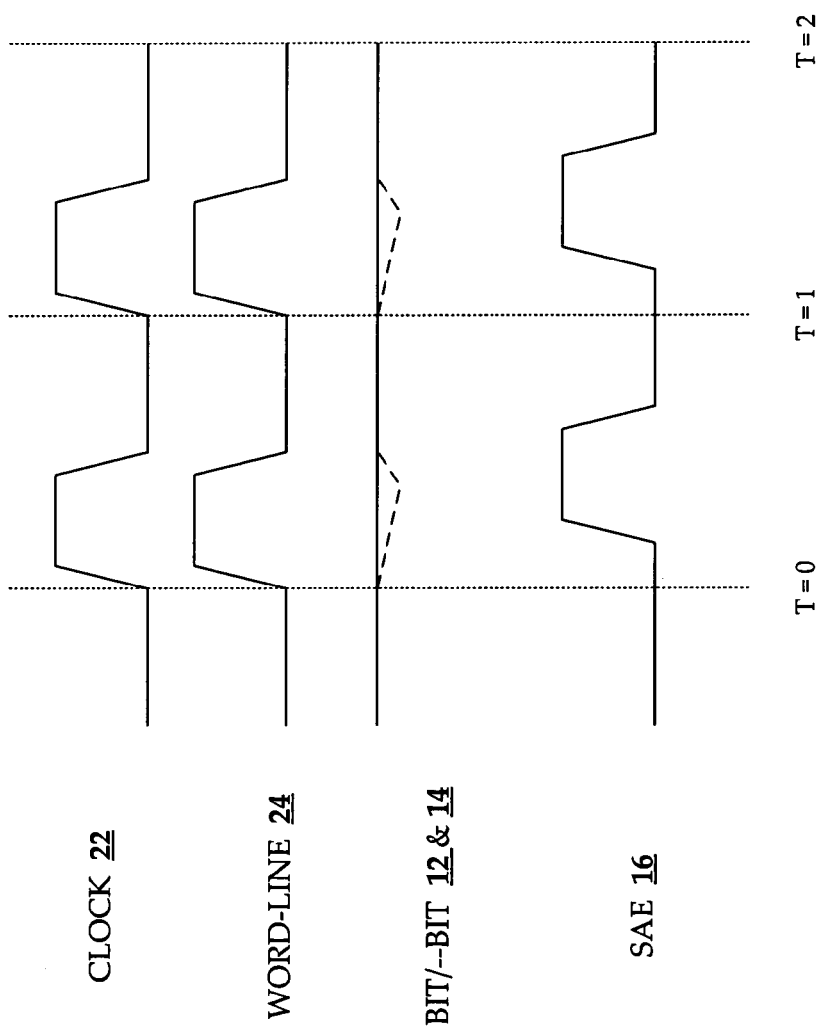
FIG. 3 illustrates a timing diagram for a back-to-back read operation, according to one embodiment of the invention.

FIG. 3 illustrates a timing diagram for a back-to-back read operation, according to one embodiment of the invention. As illustrated in FIG. 3, timing signals are shown for a clock signal 22, a word-line signal 24, complementary bit-lines BIT 12 and –BIT 14, and the sense amplifier enable signal (SAE) 16. Consistent with a read operation, at time T=0, the SAE signal 16 is low and the bit-lines are pre-charged to a high voltage state. Next, the word-line 24 associated with the particular memory cell being read is asserted and one of the two bit-lines begins to discharge. Because the bit-lines BIT and –BIT are coupled to the critical nodes CN1 and CN2 via PMOS transistors M10 and M11, which are enabled when the SAE signal is in a low voltage state, the critical nodes CN1 and CN2 will tend to gravitate toward the voltage levels of the bit-lines BIT 12 and –BIT 14. Consequently, the critical nodes CN1 and CN2 will be pre-charged and biased according to the voltage levels on the bit-lines BIT 12 and –BIT 14 just prior to enabling the sense amplifier by asserting the SAE signal 16. Accordingly, when the SAE signal is asserted—shortly after the word-line has been asserted—the voltage differential at the critical nodes CN1 and CN2 will be representative of the voltage differential that will develop when the sense amplifier is enabled. One advantage of the present invention is, because the critical nodes are biased in the direction that the nodes will seek upon activation of the sense amplifier, the voltage differential necessary to accurately latch a logical data value is reduced and the frequency, or speed, at which sense operations are performed is increased.

Figure 4:
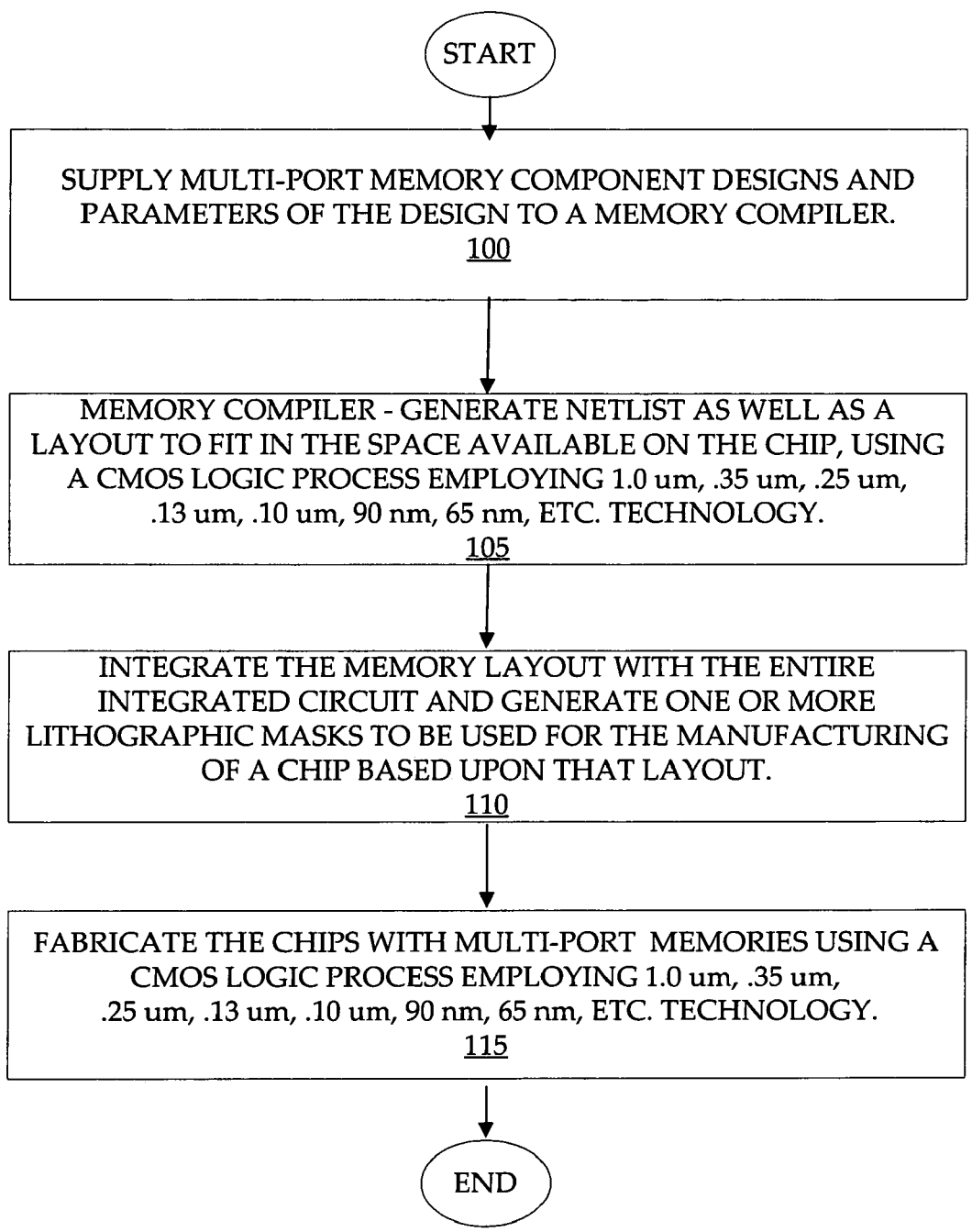
FIG. 4 illustrates an example of a process for generating a memory device with a sense amplifier consistent with an embodiment of the present invention from designs of memory components utilizing a memory compiler.

FIG. 4 illustrates an example of a process for generating a memory device with a sense amplifier consistent with an embodiment of the present invention from designs of memory components utilizing a memory compiler. In block 100, the designs for each memory component for the memory device including the sense amplifier are supplied to the memory compiler, as well as other design parameters such as the number of columns and number of rows of the array, the available size on the chip and other parameters. Thus, the designs for a memory including a sense amplifier may be supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system integrated circuit (IC) integrators to rapidly create hundreds of silicon-proven memory cores. The memory compiler may receive the memory component designs and utilize those memory component designs in conjunction with memory circuit designs to optimize a circuit design and layout in the space available on a target chip.

In block 105, the memory compiler may generate a netlist and a layout targeted to fit in the space available on a target chip. Typically, the memory compiler will store the data representing the memory and sense amplifier on a machine-readable medium. The memory compiler may select the memory component building blocks so that they are sized appropriately for the targeted fabrication technology. The memory compiler then may provide the memory layout (including the sense amplifier) to be used to generate one or more lithographic masks utilized in the fabrication of the memory device including the sense amplifier. The memory compiler may also provide a netlist for verification of the memory and sense amplifier.

In block 110, the generated memory layout may be integrated with the rest of the layout for the chip and a machine may generate the lithographic masks that contain the information necessary for the fabrication of a functional device. The machine may generate one or more lithographic masks for transferring the circuit design onto the chip.

In block 115, a fabrication facility may fabricate one or more chips with the memories utilizing the lithographic masks generated from the memory compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. According to one embodiment, light may pass through these lithographic masks onto the chip to transfer the circuit design and layout for the memory and sense amplifier onto the chip itself. In one embodiment, the memory design compiler is designed for embedded applications in a standard CMOS logic process.

In one embodiment, a memory compiler may be implemented in software as a set of instructions stored on a machine-readable medium. A machine-readable medium may include any mechanism that provides (e.g., stores and/or transmits) information in a form readable by a machine (e.g., a computer). For example, a machine-readable medium may include, but not be limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions. Instruction on a slower medium could be cached to a faster, more practical, medium.

In one embodiment, an example memory compiler may comprise the following: a graphic user interface, a common set of processing elements, and a library of files containing design elements such as circuits, control logic, and cell arrays that define the weak bit testing memory. In addition, one embodiment, a memory compiler may include object code in a set of executable software programs.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "reading" or "writing" or "calculating" or "determining" or "displaying" or the like, refer to the action and processes of a computer system, electronic circuit, or similar electronic computing device, that manipulates and transforms data represented as physical (electronic) quantities within the computer system's registers and memories into other data similarly represented as physical quantities within the computer system memories or registers, or other such information storage, transmission or display devices.

Thus, a method and system are provided with reference to specific exemplary embodiments. It will be evident that various modifications and changes may be made to these embodiments without departing from the broader spirit and scope of the invention. It will be appreciated that the present invention may be implemented to work with a wide variety of integrated circuit devices, including stand-alone memory devices, or memory devices embedded in ASICs and SoCs. Accordingly, the specification and drawings are to be regarded in an illustrative rather than a restrictive sense.

We claim:

1. A sense amplifier, comprising:
cross-coupled inverters forming a data latch having one or more output nodes, at least two input nodes, and one or more nodes connected to a power supply;
a pair of complementary bit-lines connected to the input nodes of the data latch via bias control transistors, the bias control transistors to pre-charge the input nodes based on a voltage level of the bit-lines so as to bias the voltage level at the input nodes in a direction the input nodes will seek upon activation of the sense amplifier, wherein a sense amplifier activation signal connects directly to gate terminals of the bias control transistors and a gate terminal of a ground isolation transistor.

2. The sense amplifier of claim 1, wherein the bias control transistors are p-type MOSFETs.

3. The sense amplifier of claim 1, wherein activation of the sense amplifier occurs when a sense amplifier enable signal is asserted.

4. The sense amplifier of claim 1, wherein the bias control transistors are coupled to a sense amplifier enable signal, and the bias control transistors are enabled when the sense amplifier signal is in a low voltage state and disabled when the sense amplifier enable signal is in a high voltage state.

5. The sense amplifier of claim 4, wherein a ground control transistor is enabled when the sense amplifier signal is in a high voltage state so as to form a path to ground for the sense amplifier.

6. A machine-readable medium storing data and executable instructions, which when executed by a machine to cause the machine to generate a representation of the sense amplifier of claim 1.

7. The machine-readable medium of claim 6 storing a memory compiler to provide a design for one or more lithographic masks used in fabricating a memory device including the sense amplifier.

8. A method for performing a sense operation, the method comprising:
pre-charging complementary bit-lines coupled to a particular memory cell;
enabling bias control transistors with a sense amplifier enable signal to allow input nodes of a latch-type sense amplifier to be pre-charged based on voltage levels present on the complementary bit-lines so as to bias voltage levels at the input nodes in a direction the input nodes will seek upon activation of the sense amplifier;
asserting the sense amplifier enable signal, the assertion of the sense amplifier enable signal disabling the bias control transistors and causing the sense amplifier circuit to be activated so as to latch a logical data value based on a voltage differential that develops at the input nodes; and deasserting the sense amplifier enable signal to precharge the complementary bit-lines.

9. A machine-readable medium storing data and executable instructions, which when executed by a machine to cause the machine to generate a representation of a sense amplifier to perform the method of claim 8.

10. The machine-readable medium of claim 9 storing a memory compiler to provide a design for one or more lithographic masks used in fabricating a memory device including the sense amplifier to perform the method.

* * * * *